(12) United States Patent
Tachibana et al.

(10) Patent No.: US 8,871,301 B2
(45) Date of Patent: Oct. 28, 2014

(54) COATING TREATMENT APPARATUS, COATING TREATMENT METHOD, AND NON-TRANSITORY COMPUTER STORAGE MEDIUM

(75) Inventors: Kouzou Tachibana, Koshi (JP); Takahisa Otsuka, Koshi (JP); Akira Nishiya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/344,811

(22) Filed: Jan. 6, 2012

(65) Prior Publication Data

US 2012/0189773 A1    Jul. 26, 2012

(30) Foreign Application Priority Data

Jan. 20, 2011  (JP) ................................. 2011-009864

(51) Int. Cl.
*B05D 3/12* (2006.01)
*G03F 7/16* (2006.01)
*H01L 21/67* (2006.01)
*B05D 1/00* (2006.01)

(52) U.S. Cl.
CPC ................ *B05D 1/005* (2013.01); *G03F 7/162* (2013.01); *H01L 21/6715* (2013.01)
USPC ............. 427/240; 427/425; 118/52; 118/320; 118/321; 438/780; 438/782

(58) Field of Classification Search
USPC .................... 427/240, 425; 118/52, 320, 321; 438/780, 782
See application file for complete search history.

(56) References Cited

U.S. PATENT DOCUMENTS

| 2008/0176410 A1* | 7/2008 | Muramatsu et al. | 438/758 |
| 2009/0087559 A1* | 4/2009 | Yoshihara et al. | 427/240 |
| 2010/0112209 A1 | 5/2010 | Yoshihara et al. | |
| 2011/0250765 A1* | 10/2011 | Yoshihara et al. | 438/782 |

FOREIGN PATENT DOCUMENTS

JP       2008-253986 A       10/2008

* cited by examiner

*Primary Examiner* — Kirsten Jolley
(74) *Attorney, Agent, or Firm* — Posz Law Group, PLC

(57) ABSTRACT

A coating treatment apparatus includes: a rotating and holding part; a nozzle supplying a coating solution; a moving mechanism moving the nozzle; and a control unit that controls the rotating and holding part, the nozzle, and the moving mechanism to supply the coating solution onto a central portion of the substrate and rotate the substrate at a first rotation speed, then move a supply position of the coating solution from a central position toward an eccentric position of the substrate with the substrate being rotated at a second rotation speed lower than the first rotation speed while continuing supply of the coating solution, then stop the supply of the coating solution with the rotation speed of the substrate decreased to a third rotation speed lower than the second rotation speed, and then increase the rotation speed of the substrate to be higher than the third rotation speed.

8 Claims, 11 Drawing Sheets

STEP S1

SPREAD OF RESIST SOLUTION

STEP S2

FORMATION OF SOLUTION PUDDLE DUE TO DECREASE IN SPEED AND START OF MOVEMENT OF NOZZLE

STEP S3

INCREASE IN THICKNESS OF SOLUTION PUDDLE DUE TO STOP OF MOVEMENT OF NOZZLE AND FURTHER DECREASE IN SPEED

STEP S4
STOP OF SUPPLY OF RESIST SOLUTION

STEP S5

SPREAD OF SOLUTION PUDDLE DUE TO INCREASE IN SPEED

STEP S6

FORMATION OF RESIST FILM

COATING TREATMENT APPARATUS, COATING TREATMENT METHOD, AND NON-TRANSITORY COMPUTER STORAGE MEDIUM

BACKGROUND OF THE INVENTION

1. Field of the Invention

The present invention relates to a coating treatment apparatus, a coating treatment method, and a non-transitory computer storage medium, for supplying a coating solution to a substrate to form a coating film.

2. Description of the Related Art

In a photolithography process that is one of semiconductor manufacturing processes includes a process of applying a resist onto the front surface of a semiconductor wafer (hereinafter, referred to as a "wafer") to form a resist film. The formation of the resist film is performing by a so-called spin coating of discharging a resist solution from a nozzle onto a central portion of the wafer rotated at a high speed and spreading the resist solution to the peripheral portion by the centrifugal force.

It is discussed to reduce the use of the expensive resist solution and form the resist film with a small amount of resist solution. When using a small amount of resist solution as described above, the resist film to be formed is more likely to be affected by the discharge state of the resist solution, so that even if the discharge state of the resist solution is slightly varied, a coating mottle different in thickness from the surroundings is possibly formed on the front surface of the wafer. Once the coating mottle is formed as described above, for example, a focus in exposure processing is shifted, possibly failing to obtain a resist pattern with a desired dimension.

Further, in the aforesaid spin coating, a resist solution R badly breaks when the discharge of the resist solution R from a nozzle 101 to the wafer W is stopped, and a solution droplet R1 can drop as illustrated in FIG. 19 to FIG. 21. This solution droplet R1 possibly forms the aforesaid coating mottle.

Japanese Laid-open Patent Publication No. 2008-253986 discloses an example of the spin coating to prevent occurrence of the coating mottle due to the solution droplet R1. In this spin coating, the resist solution is supplied from the nozzle to the central position of the wafer rotated at a high speed, the rotation speed of the wafer is decreased into a low speed rotation with the supply of the resist solution from the nozzle being kept, the discharge position of the resist solution is moved to an eccentric position displaced from the central position of the wafer W, and then the discharge of the resist solution is stopped. Thereafter, the rotation speed of the wafer W is increased to dry the resist. The use of this method prevents rapid drying of the solution droplet R1 on the wafer W because of a low rotation speed of the wafer and makes the centrifugal force strongly act because the drop position of the solution droplet R1 is displaced from the center of the wafer W, whereby the solution droplet spreads while fitting into the surrounding resist to prevent formation of a coating mottle.

SUMMARY OF THE INVENTION

However, it is found that the coating mottle can be formed depending on the kind of the resist even by the method disclosed in Japanese Laid-open Patent Publication No. 2008-253986. FIG. 22 illustrates a surface state of the wafer W when the supply of the resist solution R is stopped. A numeral 102 in the drawing denotes a layer of the resist solution supplied during the high speed rotation, and a numeral 103 denotes a layer of the resist solution supplied during the low speed rotation. Drying has already progressed in a lower area 104 of the resist solution layer 103, and the solution droplet R1 drops and reaches near the lower area 104 exists there without fitting into the resist solution layer 102 (FIG. 23). Then, the solution droplet R1 dries into a nucleus for forming a coating mottle and adheres to the lower area 104 which has progressed in drying accompanying the rotation of the wafer W (FIG. 24). When the rotation speed of the wafer W is increased as described above, the nucleus spreads in the radial direction on the wafer W. Then, the resist solution layers 102, 103 dry, and when a resist film 105 is formed, a linear coating mottle 106 is formed (FIG. 25). FIG. 26 illustrates the front surface of the wafer W on which the coating mottle 106 is formed.

The present invention has been made under such circumstances and an object thereof is to provide a technique capable of uniformly forming a coating film within a substrate.

The present invention to achieve the above object is a coating treatment apparatus, including: a rotating and holding part horizontally holding and rotating a substrate; a nozzle supplying a coating solution for forming a coating film on a front surface of the substrate; a moving mechanism moving the nozzle to move a supply position of the coating solution along a radial direction of the substrate between a central position of the substrate and an eccentric position displaced from the central position; and a control unit outputting a control signal to control rotation of the substrate by the rotating and holding part, discharge of the coating solution from the nozzle, and movement of the nozzle by the moving mechanism, wherein the control unit outputs the control signal to supply the coating solution onto a central portion of the substrate and rotate the substrate at a first rotation speed to spread the coating solution to a peripheral portion of the substrate by a centrifugal force, then move the supply position of the coating solution from the central position toward the eccentric position of the substrate with the substrate being rotated at a second rotation speed lower than the first rotation speed while continuing supply of the coating solution so as to form a solution puddle by raising a solution film on the central portion side of the substrate upper than a solution film on the peripheral portion side, then stop the supply of the coating solution from the nozzle to the eccentric position with the rotation speed of the substrate decreased to a third rotation speed lower than the second rotation speed so as to increase a thickness of the solution puddle to cause a solution droplet dropping to the solution puddle at a solution break from the nozzle to fit thereinto, and then increase the rotation speed of the substrate to be higher than the third rotation speed so as to spread the solution puddle to the peripheral portion of the substrate to form a coating film.

According to the present invention, at the time when moving the supply position of the coating solution from the central position to the eccentric position of the substrate and stopping the supply of the coating solution, the rotation speed of the substrate is decreased to increase the thickness of the solution puddle. This causes the solution droplet dropping from the nozzle to easily fit into the solution puddle and prevents distortion of the shape of the solution puddle, thereby enabling formation of a coating film with a high uniformity within the substrate.

The present invention according to another aspect is a coating treatment method including the steps of: horizontally holding a substrate by a rotating and holding part; supplying a coating solution for forming a coating film on a front surface of the substrate from a nozzle to a central portion of the substrate, and rotating the substrate at a first rotation speed to spread the coating solution to a peripheral portion of the substrate by a centrifugal force; then moving a supply position of the coating solution from a central position toward an eccentric position of the substrate with the substrate being rotated at a second rotation speed lower than the first rotation speed while continuing supply of the coating solution so as to form a solution puddle by raising a solution film on the central portion side of the substrate upper than a solution film on the peripheral portion side, then stopping the supply of the coating solution from the nozzle to the eccentric position with the rotation speed of the substrate decreased to a third rotation speed lower than the second rotation speed so as to increase a thickness of the solution puddle to cause a solution droplet dropping to the solution puddle at a solution break from the nozzle to fit thereinto, and then increasing the rotation speed of the substrate to be higher than the third rotation speed so as to spread the solution puddle to the peripheral portion of the substrate to form a coating film.

The present invention according to still another aspect is a non-transitory computer-readable storage medium storing a program running on a computer of a control unit controlling a coating treatment apparatus to cause the coating treatment apparatus to execute a coating treatment method for a substrate, the coating treatment method including the steps of: horizontally holding a substrate by a rotating and holding part; supplying a coating solution for forming a coating film on a front surface of the substrate from a nozzle to a central portion of the substrate, and rotating the substrate at a first rotation speed to spread the coating solution to a peripheral portion of the substrate by a centrifugal force; then moving a supply position of the coating solution from a central position toward an eccentric position of the substrate with the substrate being rotated at a second rotation speed lower than the first rotation speed while continuing supply of the coating solution so as to form a solution puddle by raising a solution film on the central portion side of the substrate upper than a solution film on the peripheral portion side, then stopping the supply of the coating solution from the nozzle to the eccentric position with the rotation speed of the substrate decreased to a third rotation speed lower than the second rotation speed so as to increase a thickness of the solution puddle to cause a solution droplet dropping to the solution puddle at a solution break from the nozzle to fit thereinto, and then increasing the rotation speed of the substrate to be higher than the third rotation speed so as to spread the solution puddle to the peripheral portion of the substrate to form a coating film.

DETAILED DESCRIPTION OF THE INVENTION

Figure 1:
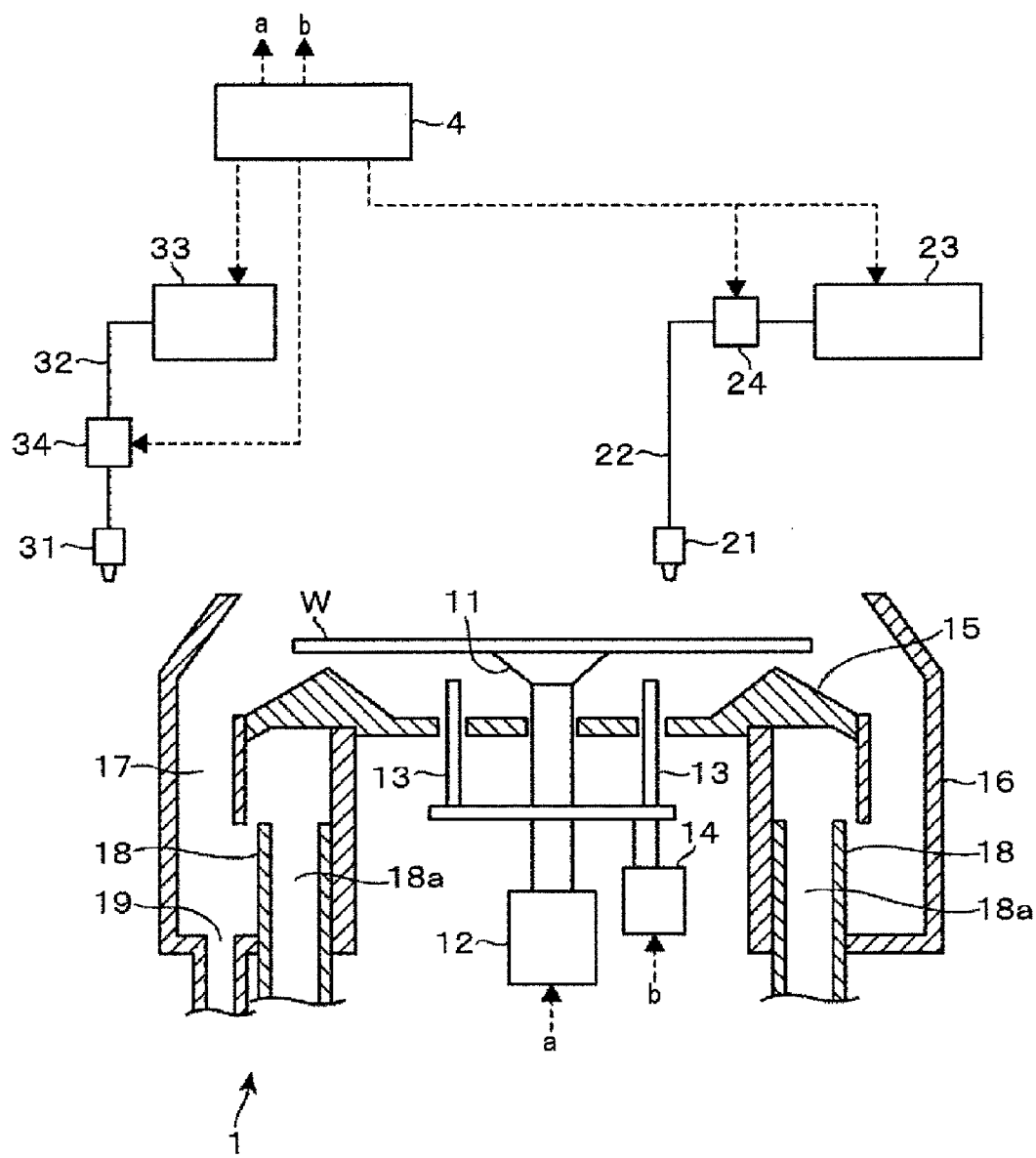
FIG. 1 is a longitudinal sectional view of a resist coating apparatus according to an embodiment.
Figure 2:
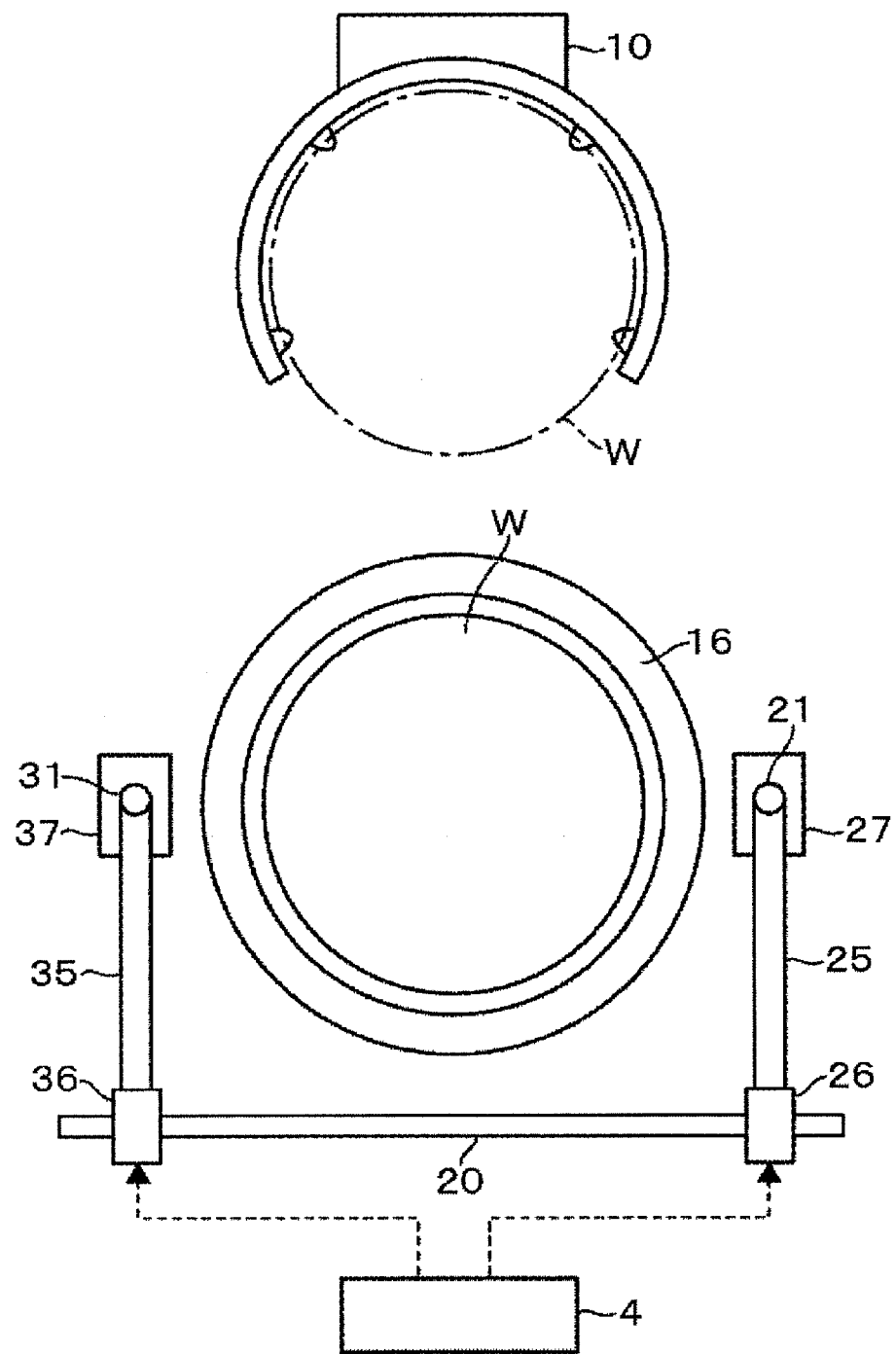
FIG. 2 is a plan view of the resist coating apparatus according to the embodiment.

A resist coating apparatus 1 as a coating treatment apparatus according to an embodiment of the present invention will be described referring to FIG. 1 and FIG. 2. FIG. 1 and FIG. 2 are a longitudinal sectional view and a plan view of the resist coating apparatus 1. The resist coating apparatus 1 includes a spin chuck 11 which is configured to horizontally hold a wafer W by vacuum suction. To the spin chuck 11, a rotation drive part 12 including a rotation motor and so on is connected. The rotation drive part 12 rotates the spin chuck 11 around a vertical axis at a rotation speed according to a control signal outputted from a later-described control unit 4.

Numerals 13 in the drawing denote three support pins (only two of them being illustrated for convenience of illustration) supporting the rear surface of the wafer W which are configured to freely rise and lower by means of a raising and lowering mechanism 14. By the support pins 13, the wafer W is passed between a transfer mechanism 10 for the wafer W and the spin chuck 11.

Below the spin chuck 11, a guide ring 15 is provided which has a cross-section in a mount shape The outer periphery of the guide ring 15 extends in a manner to bend downward. A cup 16 for suppressing scattering of the resist solution being the coating solution is provided in a manner to surround the spin chuck 11 and the guide ring 15.

The cup 16 is open on the upper side so that the wafer W can be passed to the spin chuck 11. A gap 17 forming a drainage passage is formed between the side peripheral surface of the cup 16 and the outer periphery of the guide ring 15. An exhaust pipe 18 penetrating the cup 16 in the vertical direction is provided on the lower side of the cup 16. The inside of the exhaust pipe 18 is configured as an exhaust port 18a. Further, a drain port 19 opens at the bottom of the cup 16.

The resist coating apparatus 1 includes a resist solution nozzle 21, and the resist solution nozzle 21 discharges a resist solution downward in the vertical direction. The resist solution nozzle 21 is connected to a resist solution supply source 23 storing the resist solution via a resist solution supply pipe 22. The resist solution supply source 23 includes a pump and pressure-feeds the resist solution to the downstream side. Along the resist solution supply pipe 22, a supply equipment group 24 including a valve, a flow regulation part and so on is provided to control feed/stop of the resist solution based on the control signal outputted from the control unit 4.

The resist solution nozzle 21 is connected to a moving mechanism 26 via an arm 25 extending in the horizontal direction as illustrated in FIG. 2. The moving mechanism 26 can move along a guide rail 20 extending in the horizontal direction and raise and lower the arm 25. This allows the resist solution nozzle 21 to supply the resist solution along the diameter of the wafer W and move between a waiting area 27 provided outside the cup 16 and a position above the wafer W.

The resist coating apparatus 1 includes a solvent nozzle 31, and the solvent nozzle 31 supplies a solvent, for example, a thinner downward in the vertical. The solvent nozzle 31 is connected to a solvent supply source 33 storing the thinner via the solvent supply pipe 32. A numeral 34 in the drawing denotes a supply equipment group and is configured similarly to the aforementioned supply equipment group 24. The solvent nozzle 31 is connected to a moving mechanism 36 via an arm 35 as with the resist solution nozzle 21 and configured to be movable between a waiting area 37 outside the cup 16 and a position above the wafer W.

Next, the control unit 4 will be described. The control unit 4 is composed of a computer and includes a program storage unit. The program storage unit stores a program in which commands are installed to perform a coating treatment which will be described in a later-described operation. Then, the program stored in the program storage unit is read into the control unit 4, and the control unit 4 transmits control signals to parts in the resist coating apparatus 1. This controls the movement of the nozzles 21, 31, the discharge of the resist solution from the resist solution nozzle 21, and the rotation speed of the wafer W to thereby implement a later-described step group. This program is stored in the program storage unit while being stored in a storage medium such as, for example, a hard disk, a compact disk, a magneto-optical disk or a memory card.

Figure 8:
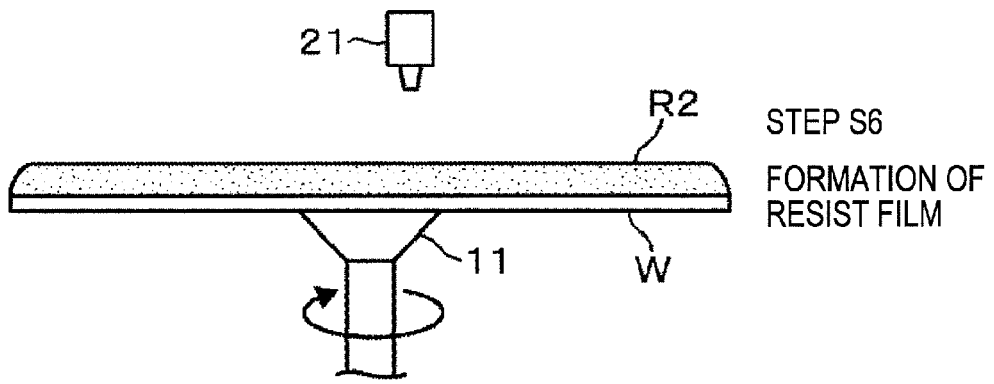
FIG. 8 is a process view in performing the resist coating treatment.
Figure 9:
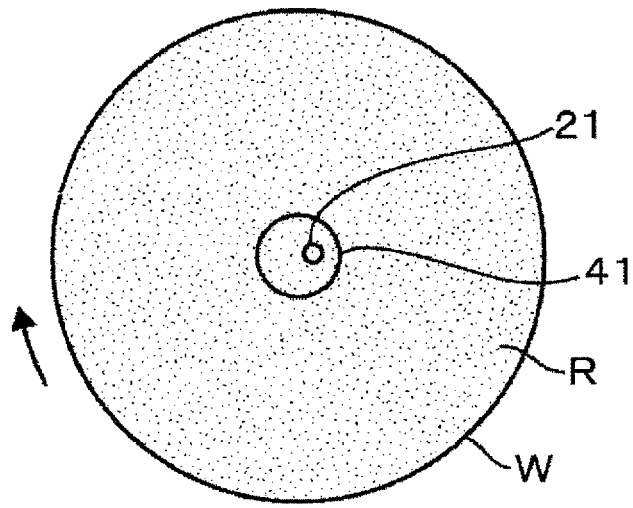
FIG. 9 is a plan view of a wafer coated with a resist.
Figure 10:
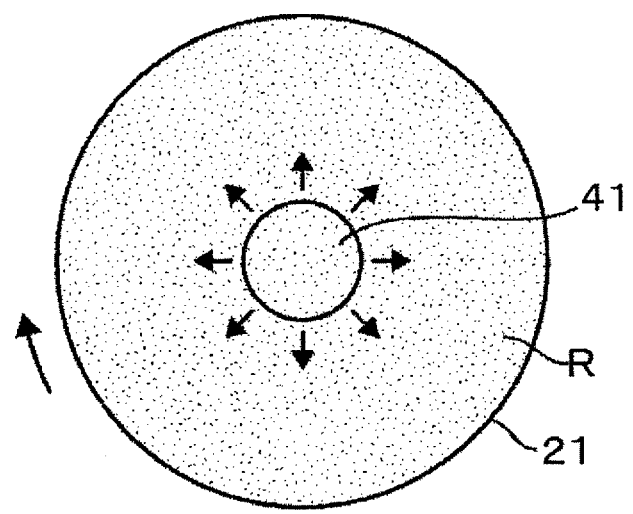
FIG. 10 is a plan view of the wafer coated with the resist.
Figure 11:
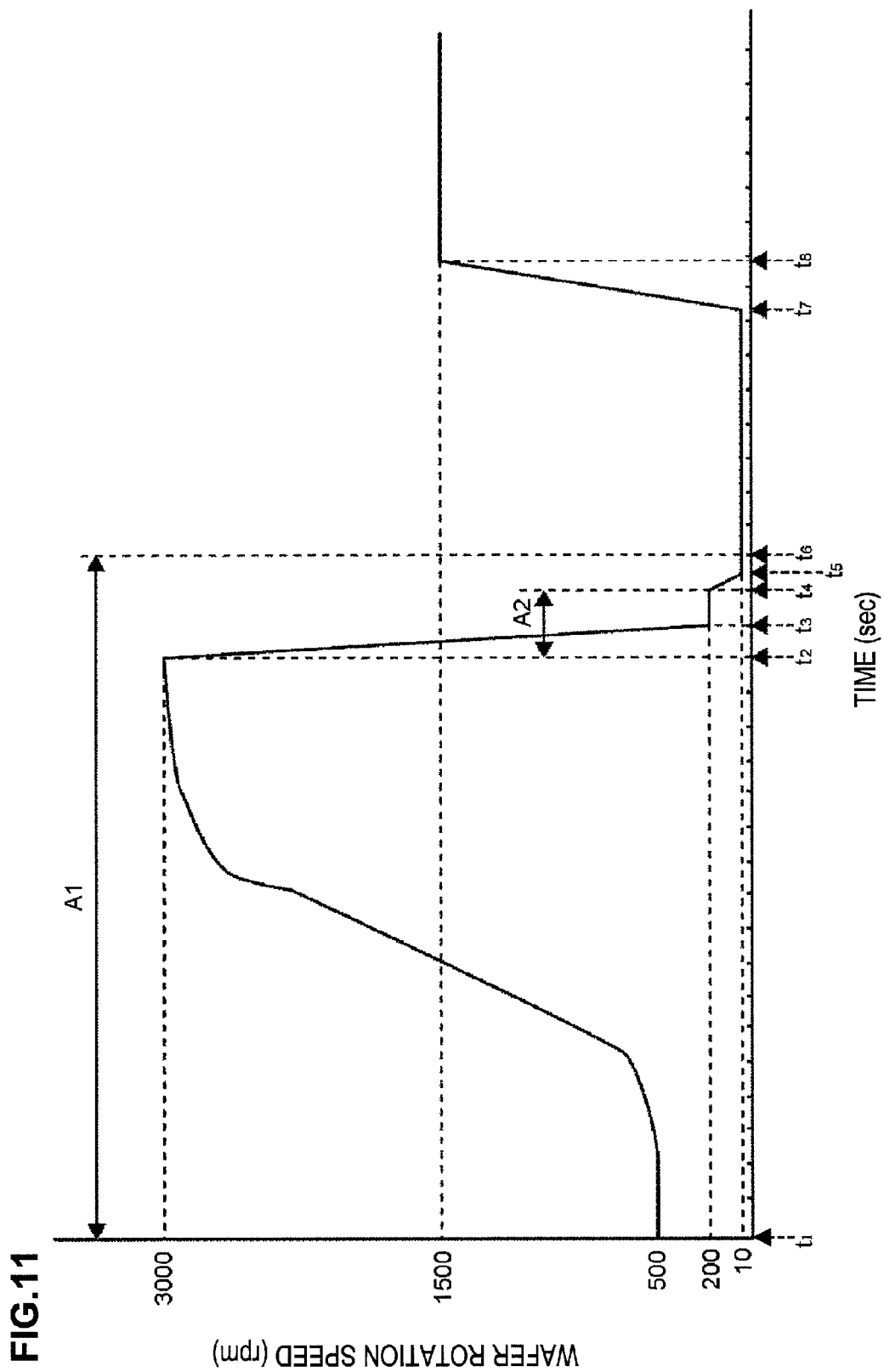
FIG. 11 is a graph chart showing changes in rotation speed of the wafer.
Figure 12:
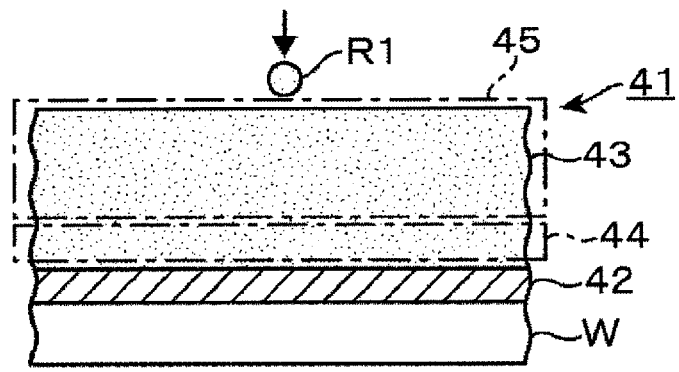
FIG. 12 is an explanatory view illustrating the change of a solution droplet dropped on the wafer.

Next, the operation of the resist coating apparatus 1 will be described referring to FIG. 3 to FIG. 10. FIG. 3 to FIG. 8 illustrate the changes of the wafer W in steps. FIG. 9 and FIG. 10 are plan views of the wafer W and illustrate the changes of a front surface of the wafer W. Further, the operation will be described referring, as necessary, also to FIG. 11 illustrating the change in rpm (the number of rotations per minute) that is the rotation speed of the wafer W. The horizontal axis and the vertical axis of the graph in FIG. 11 indicate time and rotation speed respectively, the horizontal axis having a scale interval of 0.1 seconds. Note that an arrow A1 in the graph of FIG. 11 indicates a zone in which the resist solution R is discharged. Further, an arrow A2 indicates a zone in which the supply position of the resist solution R is moved from the central position to an eccentric position of the wafer W due to the movement of the resist solution nozzle 21.

In the coating treatment, the wafer W is transferred by the transfer mechanism 10 first to the resist coating apparatus 1, and passed to the spin chuck 11 by the support pins 13. Then, the solvent nozzle 31 is moved from the waiting area 37 to a position above the central portion of the wafer W, and the wafer W is rotated, for example, at 30 rpm. Thereafter, a thinner T is supplied from the solvent nozzle 31 to the central portion of the wafer W, and the wafer W is rotated at a rotation speed of, for example, 2000 rpm. In this event, the thinner T spreads out to the peripheral portion of the wafer W by the centrifugal force.

Figure 3:
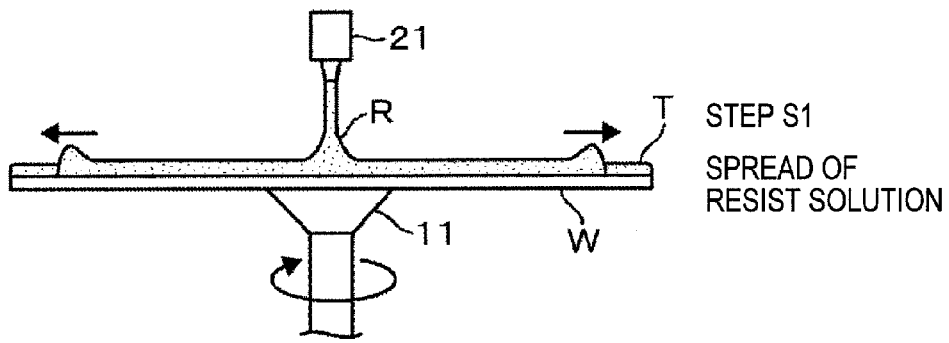
FIG. 3 is a process view in performing a resist coating treatment.

Then, the rotation speed of the wafer W is decreased to 500 rpm, and the solvent nozzle 31 is returned to the waiting area 37. Therewith, the resist solution nozzle 21 is moved from the waiting area 27 to the position above the central portion of the wafer W and supplies the resist solution R to the central portion of the wafer W (time t1 in the graph of FIG. 11), and the rotation speed of the wafer W is increased. The resist solution R spreads out to the peripheral portion over the front surface of the wafer W wetted with the thinner T by the centrifugal force as illustrated in FIG. 3, whereby the resist solution R is applied on the entire front surface of the wafer W (Step S1). When the rotation speed of the wafer W reaches, for example, 3000 rpm that is a first rotation speed, the rotation speed is decreased and the resist solution nozzle 21 starts to move toward the peripheral portion along the radial direction of the wafer W while continuing the supply of the resist solution R as illustrated in FIG. 4 (time t2 in FIG. 11) (Step S2).

Figure 4:
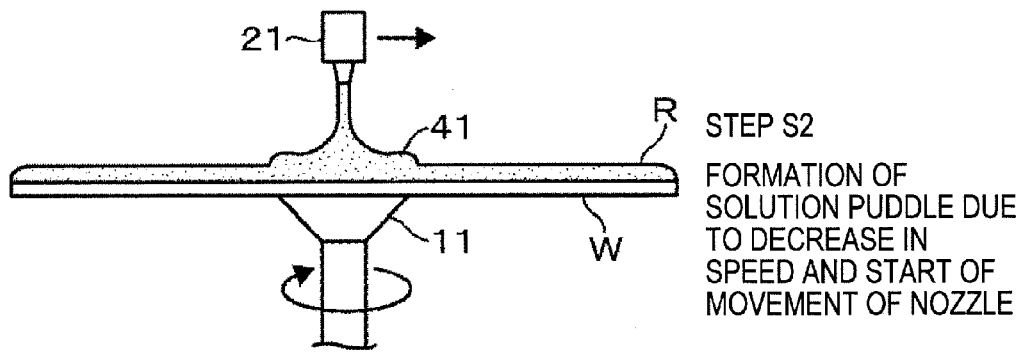
FIG. 4 is a process view in performing the resist coating treatment.

On the front surface of the wafer W, the resist solution R is drawn toward the central portion of the wafer W by the decrease in speed of the wafer W as illustrated in FIG. 4. This causes the solution film on the central portion side of the wafer W to rise upper than the solution film on the peripheral portion side of the wafer W and forms a circular solution puddle 41 at the central portion. When the rotation speed of the wafer W reaches, for example, 200 rpm (time t3 in FIG. 11), the decrease in the rotation speed is stopped and the rotation speed is maintained at 200 rpm. The interval from time t1 to time t3 is, for example, 1.8 seconds. The resist solution nozzle 21 continuously moves, and in this event the solution puddle 41 is kept circular as illustrated in FIG. 9 by a force caused by the rotation of the wafer W. Note that the rotation speed equal to or higher than 200 rpm and lower than 3000 rpm is a second rotation speed referred to in claims.

Figure 5:
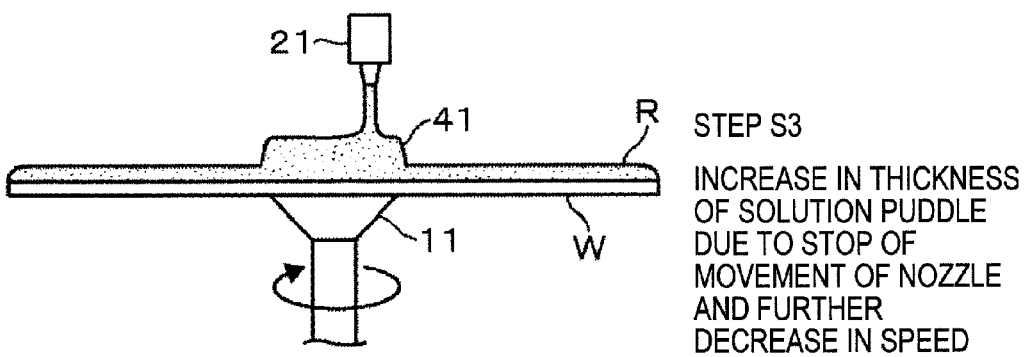
FIG. 5 is a process view in performing the resist coating treatment.
Figure 6:
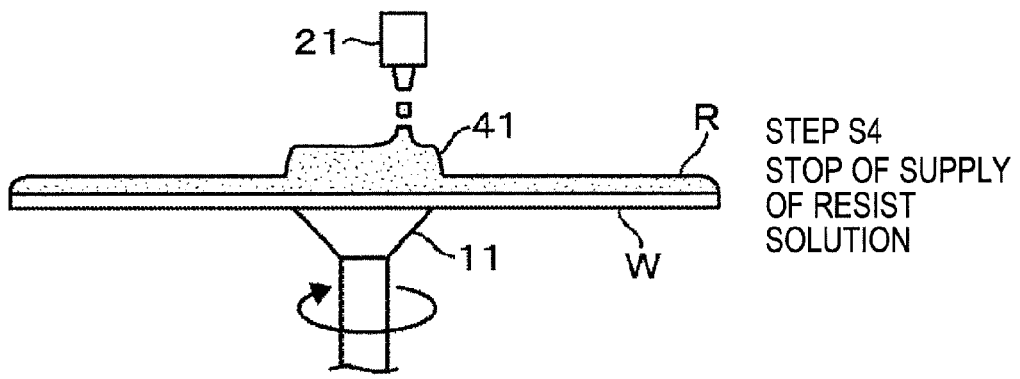
FIG. 6 is a process view in performing the resist coating treatment.

After a lapse of, for example, 0.1 seconds from time t3, the movement of the resist solution nozzle 21 is stopped at a position displaced from the position above the central portion of the wafer W by, for example, 5 mm and the rotation speed of the wafer W is further decreased (time t4 in FIG. 11), and the thickness of the solution puddle 41 is further increased as illustrated in FIG. 5 (Step S3). When the rotation speed of the wafer W reaches, for example, 10 rpm that is a third rotation speed, the decrease in the rotation speed is stopped (time t5 in FIG. 11). Thereafter, the rotation is continued at 10 rpm and the discharge of the resist solution R from the resist solution nozzle 21 is stopped as illustrated in FIG. 6 (Step S4).

The behavior of the solution droplet dropping from the resist solution nozzle 21 to the solution puddle 41 at the stop of the discharge of the resist will be described referring also to FIG. 12 to FIG. 16 illustrating the states of the front surface of the wafer W. A numeral 42 in FIG. 12 denotes a layer made of the resist solution R discharged from the resist solution nozzle 21 during time t1 to time t2. This resist solution layer 42 has progressed in drying because of the high speed rotation of the wafer W when it was discharged. Further, a numeral 43 in FIG. 12 denotes a layer made of the resist solution R supplied during time t2 to time t6. Also in this resist solution layer 43, a lower area 44 made of the resist solution R supplied earlier has comparatively progressed in drying. However, since the rotation speed is decreased to 10 rpm as described above and the thickness of the solution puddle 41 becomes large, the thickness of an upper area 45 which has comparatively not progressed in drying in the resist solution layer 43 is larger.

Figure 13:
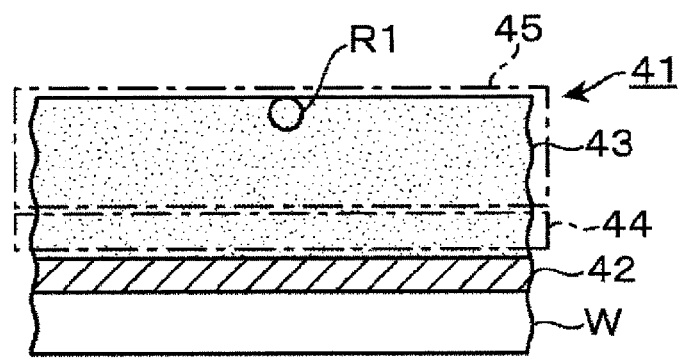
FIG. 13 is an explanatory view illustrating the change of the solution droplet dropped on the wafer.
Figure 14:
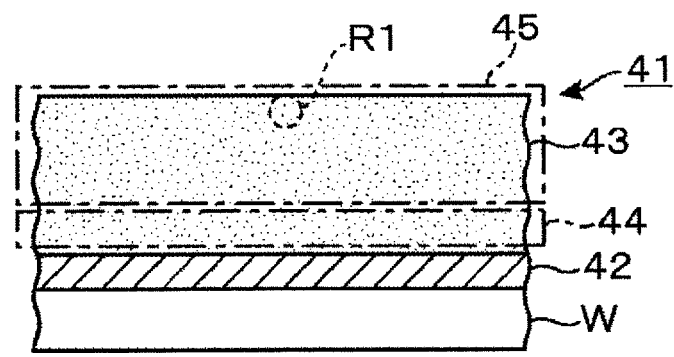
FIG. 14 is an explanatory view illustrating the change of the solution droplet dropped on the wafer.

Accordingly, a solution droplet R1 dropped as illustrated in FIG. 13 is caught in the upper area 45 without adhering to the lower area 44. In this case, because the rotation speed of the wafer W is relatively low, the drying degree of the upper area 45 does not have a large difference as compared to the drying degree of the solution droplet R1. Therefore, the solution droplet R1 fits into a resist solution R2 in the upper area 45 and starts to gradually disappear as illustrated in FIG. 14.

Figure 7:
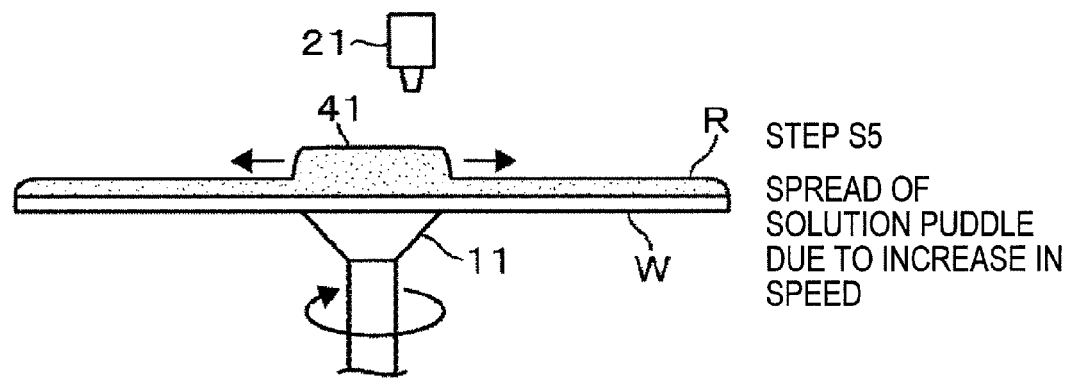
FIG. 7 is a process view in performing the resist coating treatment.
Figure 15:
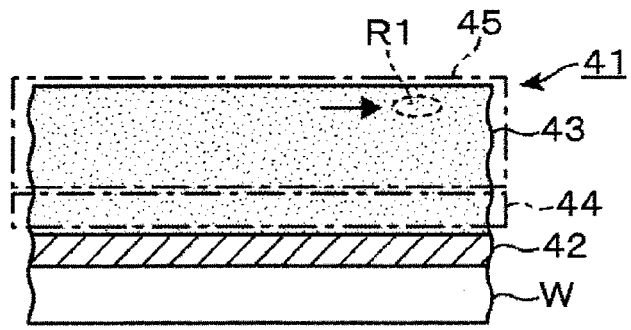
FIG. 15 is an explanatory view illustrating the change of the solution droplet dropped on the wafer.
Figure 16:
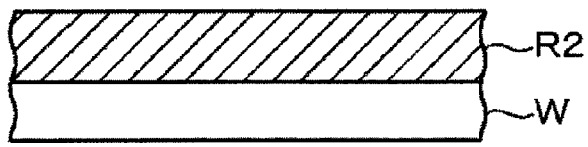
FIG. 16 is an explanatory view illustrating the change of the solution droplet dropped on the wafer.

After the stop of the discharge of the resist solution R, the resist solution nozzle 21 is returned to the waiting area 27 and the rotation of the wafer W is increased (time t7 in FIG. 11), and the solution puddle 41 is spread out to the peripheral portion of the wafer W by the action of the centrifugal force as illustrated in FIG. 7 and FIG. 10 (Step S5). The solution droplet R1 in this event mixes into the surrounding resist solution R affected by the action of the centrifugal force as illustrated in FIG. 15 and finally disappears as illustrated in FIG. 16. The interval from time t5 to time t7 is, for example, 0.8 seconds.

When the rotation speed of the wafer W reaches, for example, 1500 rpm at time t8, the increase in the rotation speed is stopped and the rotation is still continued at 1500 rpm, whereby the solvent in the resist solution R on the front surface of the wafer W volatilizes. Thus, the resist film R2 is formed as illustrated in FIG. 8 (Step S6). After a lapse of a predetermined time from time t8, the rotation of the wafer W is stopped, and the wafer W is pushed upward by the support pins 13 and passed to the transfer mechanism 10 and transferred out of the resist coating apparatus 1.

According to this resist coating apparatus 1, the rotation speed of the wafer W is decreased during the supply of the resist solution to the wafer W to form the circular solution puddle 41, the rotation speed is further decreased to increase the thickness of the solution puddle 41, and then the discharge of the resist solution from the resist solution nozzle 21 is stopped. This causes the solution droplet R1 dropped from the resist solution nozzle 21 to fit into the solution puddle 41, thereby suppressing occurrence of the coating mottle when the resist film R2 is formed. Further, during the movement of the resist solution nozzle 21, the wafer W is controlled to the rotation speed at which the distortion of the shape of the solution puddle 41 is suppressed, so that the solution puddle 41 is spread out to the peripheral portion of the wafer W while keeping substantially the circular shape at the aforesaid Step S5. In other words, the resist solution is spread to the peripheral portion of the wafer W with a high uniformity. As a result of this, the resist film can be formed in a film thickness with a high uniformity within the wafer W.

The rotation speed at Step S2 is the rotation speed at which at least the above-described solution puddle 41 is formed, and is therefore a rotation speed higher than 0 rpm. The rotation speed is preferably controlled to a rotation speed at which disturbance due to the movement of the resist solution nozzle 21 is suppressed and the solution puddle 41 is kept in a shape close to a precise circle as seen in a plan view as described above, and is controlled, for example, to 50 rpm to 1000 rpm. The rotation speed when the supply of the resist solution is stopped at Step S4 is lower than the rotation speed at Step S2 that is a rotation speed at which the coating mottle by the solution droplet R1 can be suppressed and is preferably 0 rpm to 30 rpm from later-described experiments.

The timings to start and stop the movement of the resist solution nozzle 21 may be after time t2 and before time t4 in the above-described embodiment. If the resist solution nozzle 21 moves while discharging the resist solution before time t2, the covering property for the wafer W by the resist solution R and the uniformity of the resist film R2 decrease. If the resist solution nozzle 21 moves while discharging the resist solution R after time t4, the shape of the solution puddle 41 is likely to be distorted, resulting in a decreased uniformity of the film thickness. As for the timing to stop the supply of the resist solution R, the supply of the resist solution R only needs to be stopped in the state that the solution puddle 41 becomes thick enough to suppress the occurrence of the coating mottle due to the solution droplet R1, and the supply may be stopped, for example, between times t4 to t5 when the rotation speed is being decreased.

Though the resist solution is supplied as the coating solution in this resist coating apparatus 1, the coating solution is not limited to the resist solution. For example, a chemical for forming an anti-reflection film below or above the resist film, or a chemical for forming a protection film for protecting the resist film at liquid immersion exposure may be supplied.

Hereinafter, an evaluation test carried out relating to the present invention will be described.

[Evaluation Test 1]

A resist film was formed on a wafer W1 according to the above-described embodiment. Then, the film thickness of the resist film was measured at many positions at intervals along the diameter of the wafer W1. Further, a resist film was formed on a wafer W2. The treatment of forming the resist film was almost similar to that of the above-described embodiment, but was different in that the rotation speed was brought to 200 rpm at Step S2 and then the rotation speed of the wafer W2 was not decreased at Step S3 and kept at 200 rpm for 0.2 seconds. Step S4 was carried out during the time when the rotation speed was kept at 200 rpm, and then Step S5 was carried out as in the above-described embodiment. The film thickness of the wafer W2 treated as described above was measured at many positions in the diameter direction as with the wafer W1.

Further, a resist film was formed on a wafer W3. The treatment of forming the resist film was almost similar to that of the above-described embodiment, but was different in that the rotation speed was decreased to 10 rpm at Step S2 and then the stop of the movement of the resist solution nozzle 21 and the stop of the supply of the resist solution at Steps S3, S4 were carried out with the rotation speed kept at 10 rpm. Accordingly, in the treatment to the wafer W3, the film thickness of the solution puddle was not varied in a stepwise manner. The film thickness of the resist film on the wafer W3 was also measured at many positions in the diameter direction as with the wafer W1.

Figure 17:
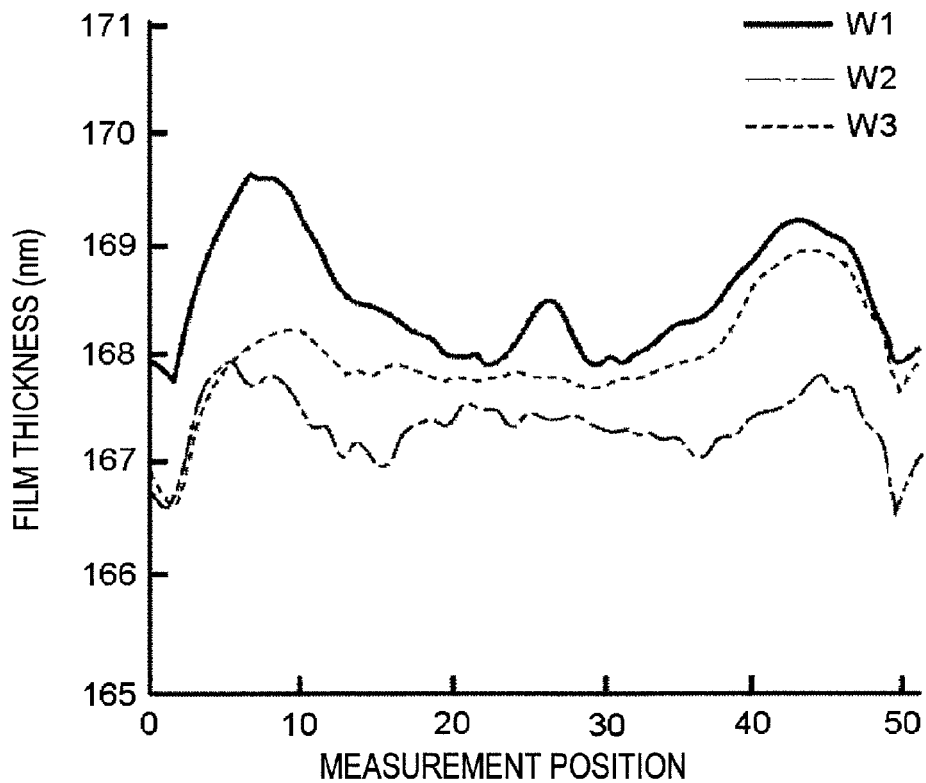
FIG. 17 is a graph chart indicating results of experiments for checking the film thickness of a resist film.

FIG. 17 is a graph indicating data on the film thickness along the diameter direction of the wafers W1 to W3. A solid line, a one-dotted chain line, and a dotted line indicated in FIG. 17 show the measurement results of the wafers W1, W2, W3 respectively. The vertical axis of the graph represents the film thickness (unit nm). The horizontal axis of the graph represents the measurement position which is digitized with one end of the wafer W as 0 and the other end as 50. As shown in the results, there was a large difference between the one end and the other end of the wafer W on the wafer W3. This is probably because the shape of the solution puddle 41 was distorted due to the movement of the discharge position of the resist solution as described in the above embodiment.

[Evaluation Test 2]

Figure 18:
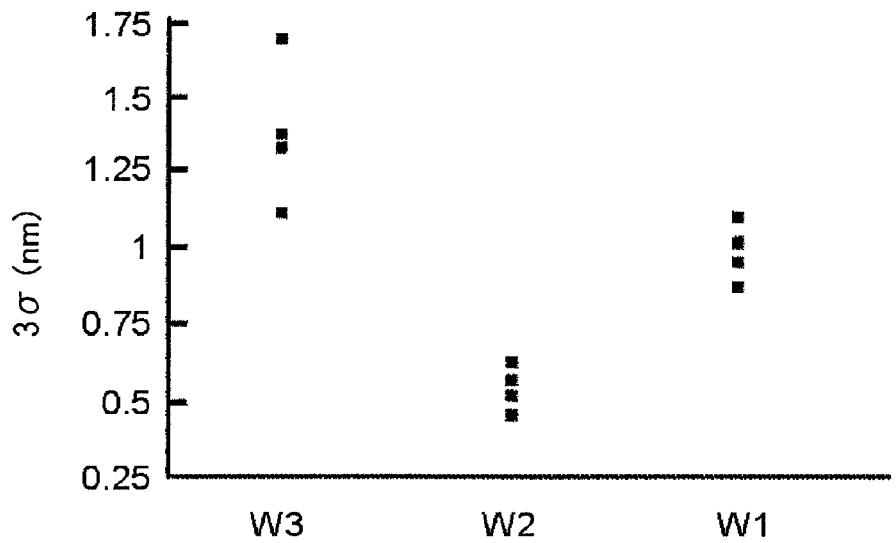
FIG. 18 is a graph chart indicating results of experiments for checking the variation in film thickness of the resist film.
Figure 19:
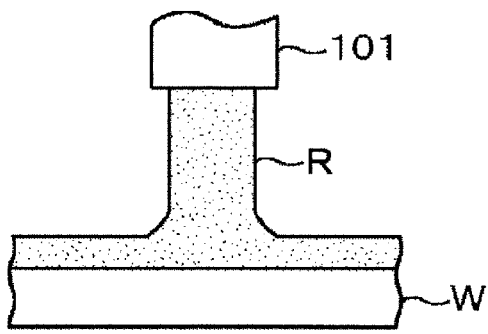
FIG. 19 is an explanatory view illustrating the appearance of solution break from a nozzle.
Figure 20:
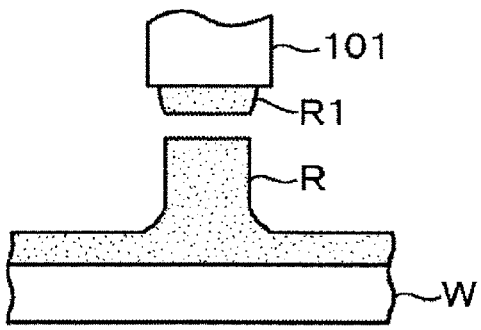
FIG. 20 is an explanatory view illustrating the appearance of the solution break from the nozzle.
Figure 21:
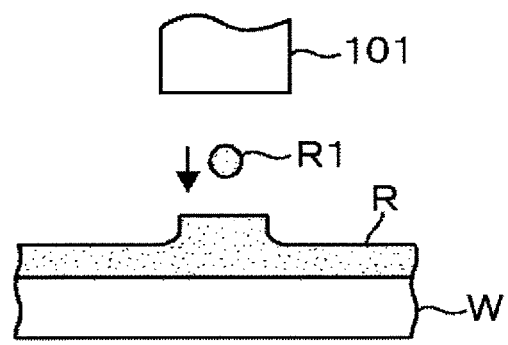
FIG. 21 is an explanatory view illustrating the appearance of the solution break from the nozzle.
Figure 22:
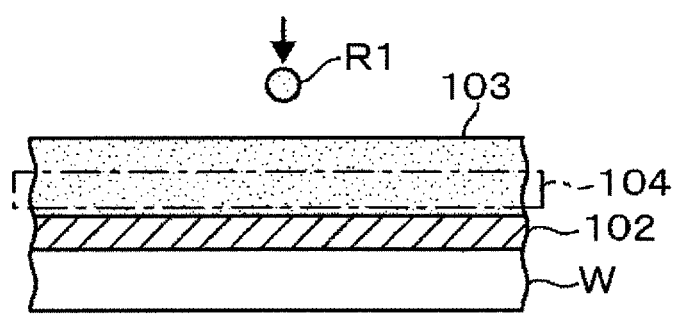
FIG. 22 is an explanatory view illustrating the change of a solution droplet dropped on the wafer.
Figure 23:
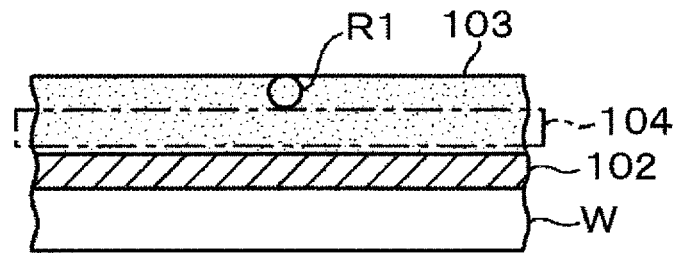
FIG. 23 is an explanatory view illustrating the change of the solution droplet dropped on the wafer.
Figure 24:
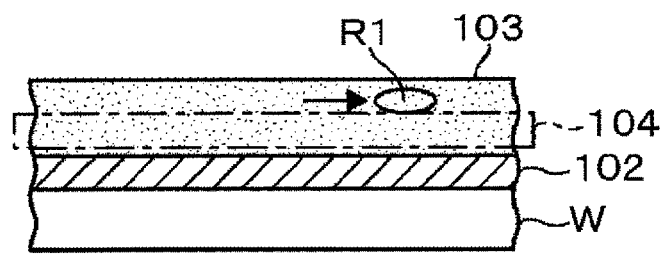
FIG. 24 is an explanatory view illustrating the change of the solution droplet dropped on the wafer.
Figure 25:
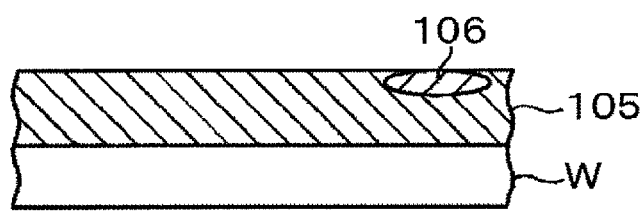
FIG. 25 is an explanatory view illustrating the change of the solution droplet dropped on the wafer.
Figure 26:
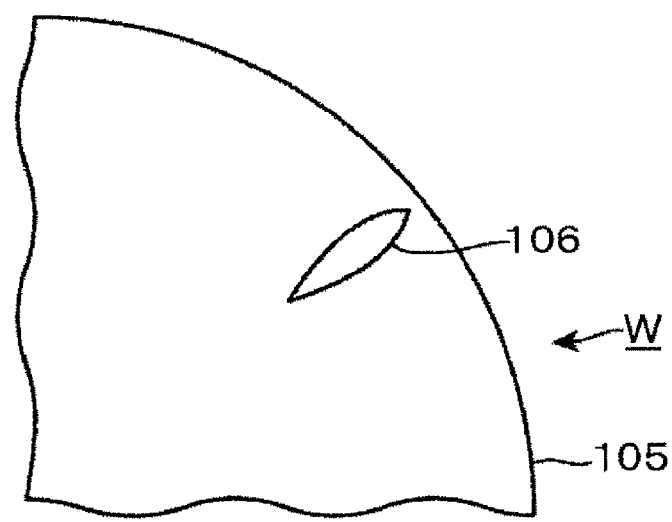
FIG. 26 is a plan view illustrating a coating mottle formed on the wafer by the solution droplet.

A plurality of each of the above-described wafers W1 to W3 were prepared, and the film thickness of the resist film was measured at 25 points at intervals along the circumferential direction at the peripheral portion and 3σ was measured. Further, the average of 3σ was calculated for each of the wafers W1, W2, W3. The graph in FIG. 18 is illustrated by plotting the values of 3σ obtained for each wafer W, and the vertical axis of the graph represents the value of 3σ. The average of 3σ of the wafer W1 was 0.99, the average of 3σ of the wafer W2 was 0.51, and the average of 3σ of the wafer W3 was 1.36.

As described in the above embodiment, the occurrence of the coating mottle can be suppressed by suppressing the rotation speed of the wafer W at the drop of the solution droplet to cause the solution droplet to fit into the surrounding resist solution. However, in the above-described evaluation tests 1, 2, the in-plane uniformities at the peripheral portions of the wafers W were higher in the order of the wafer W2>the wafer W1>the wafer W3. The result shows that when the rotation speed is increased to spread the resist solution and then rapidly decreased to 10 rpm, the variations in film thickness become larger by a factor other than the solution droplet. Since the coating mottle due to the solution droplet possibly occurs on the wafer W2 as described in the section of the Related Art, it can be efficient to change the rotation speed between the time of change of the discharge position of the resist and the time of the solution break as in the above embodiment in order to prevent a decrease in the in-plane uniformity of the film thickness on the wafer and prevent occurrence of the coating mottle due to the solution droplet.

[Evaluation Test 3]

At Steps S3 to S4 in the above embodiment, the rotation speed was decreased to 10 rpm, and treatment was performed on each of the wafers W while changing the interval from times t4 to t7 when the rotation speed was kept at 10 rpm, and the frequency of occurrence of the coating mottle was checked. Further, treatment was performed on the wafers W while controlling the rotation speed to a speed different from 10 rpm at Steps S3 to S4 instead of decreasing it to 10 rpm, and the frequency of occurrence of the coating mottle was checked. In this evaluation test 3, the discharge amount of the resist solution was set to 0.55 mL and the discharge time of the resist solution was set to 1.9 seconds. The following table 1 shows the results of the evaluation test 3.

TABLE 1

| | | Time of Steps S3 to S4 | | | | | | |
| --- | --- | --- | --- | --- | --- | --- | --- | --- |
| | | 0.2 sec. | 0.3 sec. | 0.4 sec. | 0.5 sec. | 0.6 sec. | 0.7 sec. | 0.8 sec. |
| Rotation Speed | 10 rpm | 1/25 | | 1/25 | | 0/50 | | 0/50 |
| | 20 rpm | | | | | | | |
| | 30 rpm | | | | | 0/50 | | |
| | 40 rpm | | | | | | | |
| | 50 rpm | | | | | 1/25 | | |

As shown in Table 1, in the experiment in which the rotation speed was set to 10 rpm and the execution time of Steps S3 to S4 was set to 0.2 seconds, 0.4 seconds, the coating mottle occurred at a rate of one per 25 wafers W. In the experiment in which the rotation speed was set to 10 rpm and the execution time of Steps S3 to S4 was set to 0.6 seconds, 0.8 seconds, the occurrence of coating mottle was not found in any of 50 wafers W. In the experiment in which the rotation speed was set to 30 rpm and the execution time of Steps S3 to S4 was set to 0.6 seconds, the occurrence of coating mottle was not found in any of 50 wafers W. In the experiment in which the rotation speed was set to 50 rpm and the execution time of Steps S3 to S4 was set to 0.6 seconds, the coating mottle occurred at a rate of one per 25 wafers W.

It is found from the results of the evaluation test 3 that the occurrence of coating mottle is suppressed more as the rotation speed at Steps S3 to S4 is lower, and the occurrence of coating mottle is suppressed more as the execution time of Steps S3 to S4 is longer. In the experiment in which the execution time of Steps S3 to S4 was set to 0.6 seconds as described above, the occurrence of coating mottle was not observed in the case of the rotation speed set to 10 rpm, 30 rpm. In the experiment in which the execution time of Steps S3 to S4 was set to 0.8 seconds, the occurrence of coating mottle was not observed in the case of the rotation speed set to 10 rpm. In these experiments, it is considered that when the rotation speed of the wafer W is set to lower than 10 rpm, the drying of the front surface of the solution puddle 41 is suppressed more and the solution droplet is more likely to fit into the solution puddle 41. Accordingly, the evaluation test 3 shows that the preferable rotation speed at Steps S3 to S4 is 0 rpm to 30 rpm.

What is claimed is:

1. A coating treatment method, comprising the steps of:
    horizontally holding a substrate by a rotating and holding part;
    supplying a coating solution for forming a coating film on a front surface of the substrate from a nozzle to a central portion of the substrate, and rotating the substrate at a first rotation speed to spread the coating solution to a peripheral portion of the substrate by a centrifugal force;
    then decreasing a rotation speed of the substrate to a second rotation speed lower than the first rotation speed and keeping the rotation speed of the substrate at the second rotation speed for a first predetermined time while continuing supply of the coating solution, and moving the nozzle from a central position toward an eccentric position of the substrate with the substrate being rotated,
    then decreasing the rotation speed of the substrate to a third rotation speed lower than the second rotation speed and keeping the rotation speed of the substrate constant at the third rotation speed for a second predetermined time while continuing supply of the coating solution, and then stopping the supply of the coating solution from the nozzle to the eccentric position after a lapse of a third predetermined time from a time when the rotation speed of the substrate reaches the third rotation speed, and
    then increasing the rotation speed of the substrate to be higher than the third rotation speed so as to spread a solution puddle to the peripheral portion of the substrate to form a coating film.

2. The coating treatment method as set forth in claim 1 wherein the movement of the nozzle is stopped at the eccentric position while the substrate is rotated at the second rotation speed.

3. The coating treatment method as set forth in claim 2, wherein the third rotation speed is 0 rpm to 30 rpm.

4. The coating treatment method as set forth in claim 2, wherein the second rotation speed is 50 rpm to 1000 rpm.

5. The coating treatment method as set forth in claim 3, wherein the second rotation speed is 50 rpm to 1000 rpm.

6. The coating treatment method as set forth in claim 1, wherein the third rotation speed is 0 rpm to 30 rpm.

7. The coating treatment method as set forth in claim 1, wherein the second rotation speed is 50 rpm to 1000 rpm.

8. A non-transitory computer-readable storage medium storing a program running on a computer of a control unit controlling a coating treatment apparatus to cause the coating treatment apparatus to execute a coating treatment method for a substrate, said coating treatment method comprising the steps of:

horizontally holding a substrate by a rotating and holding part;

supplying a coating solution for forming a coating film on a front surface of the substrate from a nozzle to a central portion of the substrate, and rotating the substrate at a first rotation speed to spread the coating solution to a peripheral portion of the substrate by a centrifugal force;

then decreasing a rotation speed of the substrate to a second rotation speed lower than the first rotation speed and keeping the rotation speed of the substrate at the second rotation speed for a first predetermined time while continuing supply of the coating solution, and moving the nozzle from a central position toward an eccentric position of the substrate with the substrate being rotated, then decreasing the rotation speed of the substrate to a third rotation speed lower than the second rotation speed and keeping the rotation speed of the substrate constant at the third rotation speed for a second predetermined time while continuing supply of the coating solution, and then stopping the supply of the coating solution from the nozzle to the eccentric position after a lapse of a third predetermined time from a time when the rotation speed of the substrate reaches the third rotation speed, and then increasing the rotation speed of the substrate to be higher than the third rotation speed so as to spread a solution puddle to the peripheral portion of the substrate to form a coating film.

* * * * *